United States Patent [19]
Subramanian et al.

[11] Patent Number: 5,721,167
[45] Date of Patent: Feb. 24, 1998

[54] PROCESS FOR FORMING A SEMICONDUCTOR DEVICE AND A STATIC-RANDOM-ACCESS MEMORY CELL

[75] Inventors: Chitra Subramanian, Austin; James D. Hayden, Austin; Olubunmi Adetutu, Austin; Dean Denning, Del Valle; Arkalgud R. Sitaram, Austin, all of Tex.

[73] Assignee: Motorola, Inc., Schaumburg, Ill.

[21] Appl. No.: 797,142

[22] Filed: Feb. 10, 1997

[51] Int. Cl.$^6$ .............................................. H01L 21/8244
[52] U.S. Cl. ..................... 438/238; 438/241; 438/279
[58] Field of Search ............................. 438/238, 241, 438/258, 266, 279; 257/903–904

[56] References Cited

U.S. PATENT DOCUMENTS

| | | | |
|---|---|---|---|
| 4,590,508 | 5/1986 | Hirakawa et al. | 257/250 |
| 4,848,801 | 7/1989 | Honjyo et al. | 257/250 |
| 5,179,033 | 1/1993 | Adan | 438/238 |
| 5,371,026 | 12/1994 | Hayden et al. | 437/41 |

OTHER PUBLICATIONS

James R. Pfiester, "Semiconductor Device having Electrically coupled Transistors With a Differential Current Gain," U.S. patent application serial number 08/459,198, Filed Jun. 2, 1995.

*Primary Examiner*—Jey Tsai
*Attorney, Agent, or Firm*—George R. Meyer

[57] ABSTRACT

A semiconductor device (10) is formed having an SRAM array with a plurality of SRAM cells. In forming the access and latch transistors, two different gate electrode compositions are used to form the access and latch transistors. More specifically, a dielectric layer (22) is formed between two conductive layers (26 and 28) within the gate electrode (52) for the access transistors while the dielectric layer is not formed between the two conductive layers (26 and 28) for the latch transistors. This structure allows an increase in the beta ratio for the SRAM cell thereby making a more stable SRAM cell without having to use diffused resistors between the access transistors in storage nodes or by having to form a differential thickness between the gate dielectric layers for the latch transistors and the access transistors.

13 Claims, 3 Drawing Sheets

PROCESS FOR FORMING A SEMICONDUCTOR DEVICE AND A STATIC-RANDOM-ACCESS MEMORY CELL

RELATED APPLICATIONS

This is related to U.S. patent application No. 08/459,198 filed on Jun. 2, 1995, assigned to the current assignee hereof.

FIELD OF THE INVENTION

This invention relates in general to semiconductor devices and processing, and more particularly, semiconductor devices including static random access memory (SRAM) cells and processes for forming them.

BACKGROUND OF THE INVENTION

Static-random-access memory (SRAM) cells require stability to prevent bits from being changed when reading the data from the cells. To achieve proper stability, a parameter referred to as the beta ($\beta$) ratio, which is a ratio of the transconductance between the latch and the access transistors in an SRAM cell, is designed to be at least three.

A number of ways exist for controlling the $\beta$ ratio. Adjusting the channel widths and channel lengths of the access and latch transistors affect the $\beta$ ratio. The $\beta$ ratio of the channel width divided by the channel length of the latch transistors should be about three times greater than the channel width divided by the channel length of the access transistors. As an equation, $\beta$ ratio is a function of:

$$\frac{(W/L)_{latch}}{(W/L)_{access}}$$

However, physical dimensions must be kept within limits to achieve the smallest SRAM cell possible. Therefore, achieving a $\beta$ ratio of at least three solely by adjusting the channel widths and lengths is typically done at the expense of increased SRAM cell area.

Other methods can be used to adjust the $\beta$ ratio. For example, a resistor is inserted between the access transistors and the storage nodes. However, controlling this resistance requires fairly tight mask alignment because mask misalignment significantly changes the resistance of one or both resistors within the SRAM cell.

Another method of adjusting the beta ratio is to change the doping level within the gate electrodes of the access and latch transistors. More particularly, a moderately lower doped polysilicon layer overlies the gate dielectric for the access transistors while a relatively heavier doped polysilicon layer overlies the gate dielectric for the latch transistors. A modification of this gate doping method includes using a conductive silicon nitride film between the lower less heavily doped polysilicon layer and the overlying more heavily doped polysilicon layer for the access transistors. Subsequent heat cycles may cause dopant within the heavier doped polysilicon layer to diffuse into the lower doped polysilicon layer to the point of making the lower polysilicon layer conductive.

A need exists for forming a more stable SRAM cell that has a relatively high beta ratio that does not excessively complicate the process flow used to from the transistors.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A semiconductor device is formed having an SRAM array with a plurality of SRAM cells. In forming the access and latch transistors, two different gate electrode compositions are used to form the access and latch transistors. More specifically, a dielectric layer is formed between two conductive layers within the gate electrodes for the access transistors while the dielectric layer is not between the two conductive layers for the latch transistors. This structure allows an increase in the $\beta$ ratio for the SRAM cell thereby making a more stable SRAM cell without having to use diffused resistors between the access transistors in storage nodes or by differential conductivity between the gate electrodes for the latch transistors and the access transistors.

Figure 1:
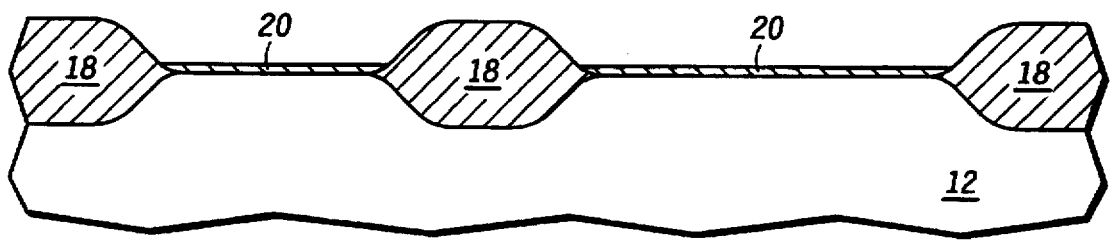
FIG. 1 includes an illustration of a cross-sectional view of a portion of a semiconductor device substrate after forming field isolation regions and a gate dielectric layer.

FIG. 1 includes an illustration of a cross-sectional view of a portion of a semiconductor device substrate 12. The semiconductor device substrate 12 includes a monocrystalline semiconductor wafer, a semiconductor-on-insulator wafer, or any other type of substrate used to form semiconductor devices. Field isolation regions 18 are formed from portions of the semiconductor device substrate 12. The field isolation regions 18 are typically formed by a selective oxidation process or a trench field isolation process. A gate dielectric layer 20 is then formed over portions of the semiconductor device substrate 12 between the field isolation regions 18. The gate dielectric layer 20 is formed by thermally oxidizing a portion of the semiconductor device substrate 12 or by depositing a dielectric material over the substrate 12. The gate dielectric layer 20 includes silicon dioxide, a nitrided oxide, a nitride, or the like. The gate dielectric layer typically has a thickness in range of 50 to 100 angstroms. In other embodiments, the thickness of the gate dielectric layer can be thicker or thinner than those limits previously described.

Figure 2:
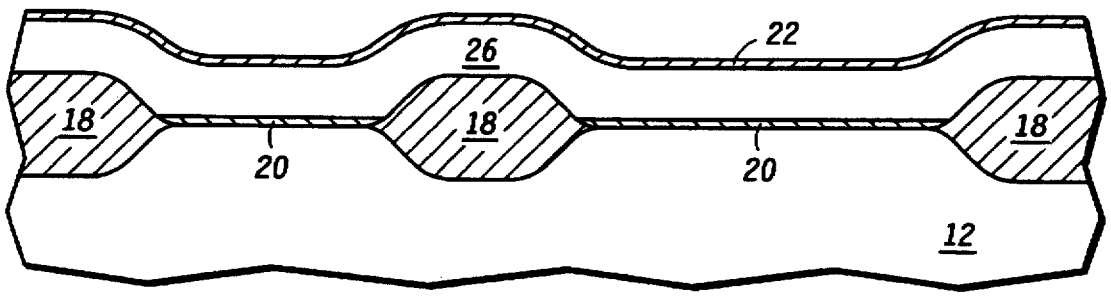
FIG. 2 includes an illustration of a cross-sectional view of the substrate of FIG. 1 after forming a first conductive layer and a dielectric layer over that first conductive layer.

A first conductive layer 26 and first dielectric layer 22 are formed over the field isolation regions 18 and gate dielectric layer 20 as shown in FIG. 2. The first conductive layer 26 typically includes silicon and is formed by chemical vapor deposition (CVD) of amorphous silicon, polycrystalline silicon, or the like. The first dielectric layer 22 is formed by thermally oxidizing a portion of the conductive layer 26 or by depositing a dielectric material over the first conductive layer 26. The first dielectric layer 22 includes silicon dioxide, silicon nitride, or a high dielectric constant insulating film including tantalum pentoxide or the like. High dielectric constant materials typically have a dielectric constant of at least five. The thickness of the first dielectric layer 22 is typically in a range of 30 to 150 angstroms thick. Typically, seventy angstroms is an adequate thickness. Other thicknesses can be used accordingly, but typically should be anywhere from approximately one to three times thicker than the gate dielectric layer 20.

Figure 3:
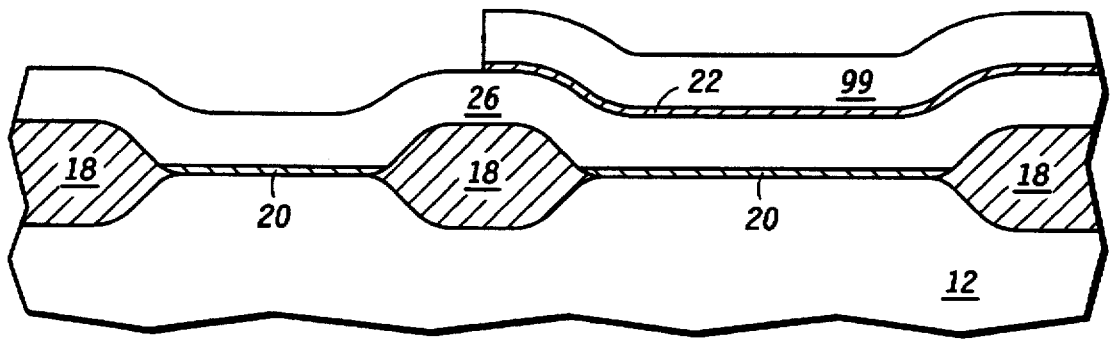
FIG. 3 includes an illustration of a cross-sectional view of the substrate of FIG. 2 after patterning the dielectric layer in accordance with one embodiment of the present invention.

A photoresist layer is coated and patterned over the dielectric layer 22 to form a photoresist member 99 as shown in FIG. 3. The exposed portions of the first dielectric layer 22 are etched over a region of the substrate 12 where a latch transistor of an SRAM cell will be subsequently formed. The etch is performed using a conventional method including dry etching, wet etching, or the like. Typically, anisotropic etching is preferred to keep the dimensions under reasonably good control. The dielectric layer 22 overlies a portion of the semiconductor device substrate 12 where an access transistor will be subsequently formed. The photoresist member 99 is removed following the etch.

Figure 4:
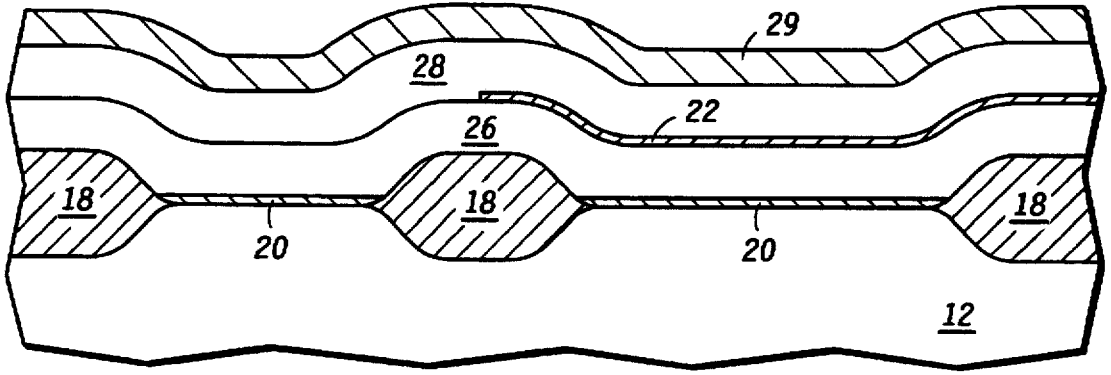
FIG. 4 includes an illustration of a cross-sectional view of the substrate of FIG. 3 after forming a second conductive layer and an antireflective coating over the patterned dielectric layer.

A second conductive layer 28 and an antireflective coating (ARC) 29 are then formed over the remaining portion of the first dielectric layer 22 and the first conductive layer 26 as shown in FIG. 4. The second conductive layer 28 is typically formed using a chemical vapor deposition of a silicon-containing material. Examples include doped silicon or a metal silicide including titanium disilicide, tantalum disilicide, tungsten silicide (WSi$_x$), cobalt disilicide, platinum disilicide, or the like. The antireflective coating (ARC) 29 includes a nitride material, such as silicon nitride, silicon-rich silicon nitride, and other metallic nitrides. In general, a silicon nitride material, whether stoichiometric or silicon rich is typically used since it is compatible with the process flow and should not cause contamination or other impurity related issues. If needed, a silicon layer (not shown) is formed between the second conductive layer 28 and ARC 29 to improve adhesion.

Figure 5:
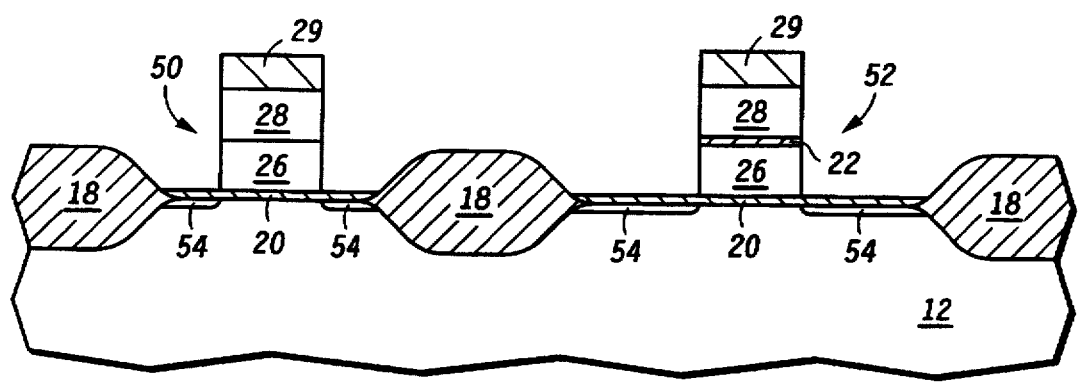
FIG. 5 includes an illustration of a cross-sectional view of the substrate of FIG. 4 after patterning to form gate electrodes for latch and access transistors in accordance with one embodiment of the present invention.

The layers 26, 22, and 28 and ARC 29 are patterned as illustrated in FIG. 5. Near the left-hand edge of the FIG. 5, a gate electrode 50 for a latch transistor includes the first conductive layer 26 and the second conductive layer 28 that is over the first conductive layer 26. Note that no dielectric layer, including dielectric layer 22, lies between the first and second conductive layers 26 and 28 in the gate electrode 50 in FIG. 5. In another embodiment, a native dielectric layer may lie between the first and second conductive layers 26 and 28 for the gate electrode 50. However, such a native dielectric layer typically has a thickness no more than 20 angstroms. Near the right-hand side of FIG. 5, a gate electrode 52 for an access transistor includes the first conductive layer 26, the first dielectric layer 22, and the second conductive layer 28. The gate electrode 52 is part of the word line for the SRAM memory array within the semiconductor device. The substrate 12 is doped by ion implantation to form doped regions 14 that are source and drains for the access and latch transistors.

Figure 6:
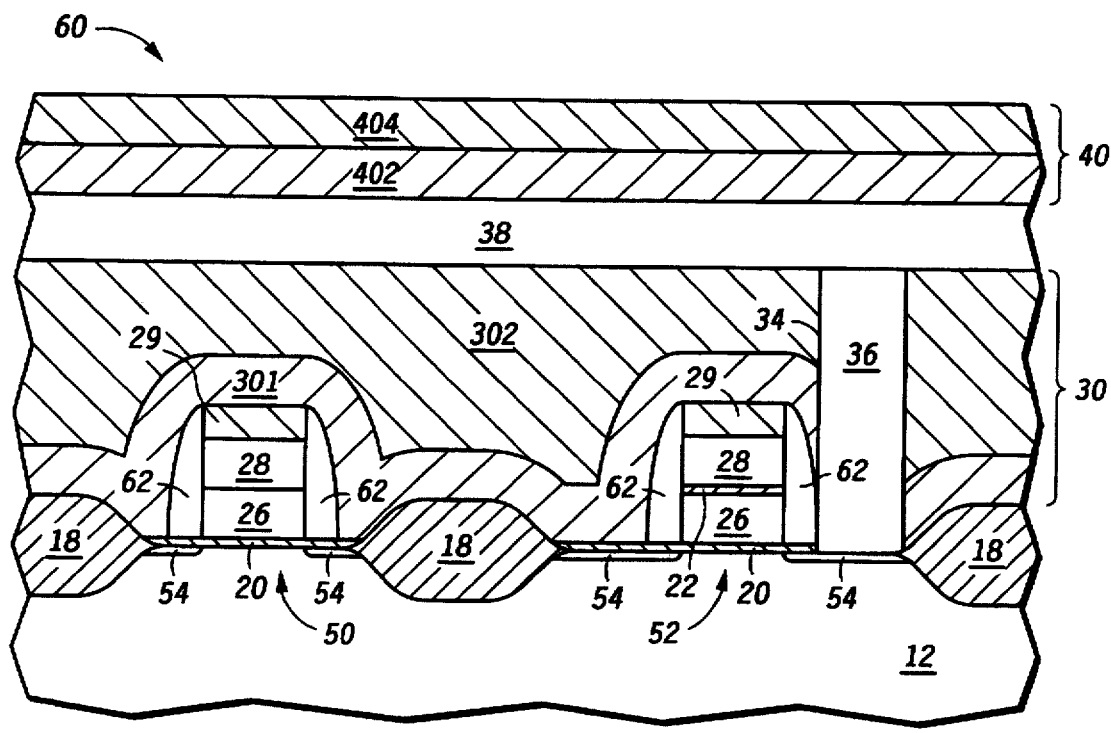
FIG. 6 includes an illustration of a cross-sectional view of the substrate of FIG. 5 after forming a substantially completed semiconductor device.

Processing continues until a substantially completed semiconductor device 60 is formed as illustrated in FIG. 6. Sidewall spacers 62 are formed adjacent to the gate electrodes 50 and 52. An insulating layer 30 is formed over the gate electrodes 50 and 52 and sidewall spacers 62. The insulating layer 30 is typically formed using chemical vapor deposition and typically includes an undoped oxide film 301 and a doped oxide film 302. The insulating layer 30 is patterned to form a contact opening 34. A conductive plug 36 is formed within the contact opening 34. An interconnect 38 is formed over the conductive plug 36 and the insulating layer 30. The interconnect 38 is a bit line and includes aluminum, copper, or the like. Barrier or adhesion layers can be present within the conductive plug 36 or with the interconnect 38 and typically includes materials such as titanium, titanium nitride, tantalum nitride, and the like. Finally, a passivation layer 40 is formed over the interconnect 38. In one embodiment, passivation layer 40 includes a doped oxide film 402 and a silicon nitride film formed by plasma enhanced chemical vapor deposition. In another embodiment, the passivation layer is formed of a single material, such as silicon oxynitride and the like. Although not shown in the figures, other insulating layers and interconnect levels can be formed if needed to form a substantially completed device.

The embodiment of the present invention includes a number of advantages over prior art SRAM cells and their methods of formation. More particularly, the β ratio of the SRAM cell is improved by having an effectively thicker dielectric layer for the access transistors compared to the latch transistors. Assume that the gate dielectric layer 20 has approximately 50 angstroms of oxide thickness for both the latch and access transistors, and the first dielectric layer 22 has approximately 75 angstroms of oxide thickness. For the latch transistors, the gate dielectric thickness is roughly equivalent to 50 angstroms of oxide in one embodiment. However, the access transistors include the gate dielectric layer 20 and the first dielectric layer 22. In this particular embodiment, the electrically measured oxide equivalent thickness of the gate dielectric for the latch transistors is approximately 50 angstroms, and the electrically measured oxide equivalent thickness of the access transistors is approximately 125 angstroms. The β ratio of the SRAM cells improve by essentially having an effective differential gate oxide thickness between the latch and access transistors. Unlike other differential gate oxide thickness processes, photoresist is not in direct contact with the gate dielectric layer 20 before forming the first conductive layer 26. This allows for a cleaner and less contaminated interface between the gate dielectric layer 20 and the first conductive layer 26.

The embodiment of the present invention also has an advantage over the prior art resistor formation process in that the masking layer used to pattern the first insulating layer 22 is relatively less critical in alignment compared to a resistor formation mask used when a resistor is placed between the storage node and the access transistors. Therefore, this process allows for greater process margin compared to the SRAM cells having resistors between the access transistors and the storage nodes.

The first conductive layer 26 is not electrically connected to the second conductive layer 28. In one embodiment, the first dielectric layer 22 extends the entire length of the bit line for the SRAM array. Although the first conductive layer 26 could be charged similar to a floating gate of an electrically programmable read only memory cell, the potential used within this memory cell and the electrical fields generated when using this memory cell are typically low enough that long-term reliability issues with potentially accumulating charge within the first conductive layer 26 over the access transistors should be relative minimal. Therefore, the semiconductor device 10 is expected to have reasonably acceptable long-term reliability.

Figure 7:
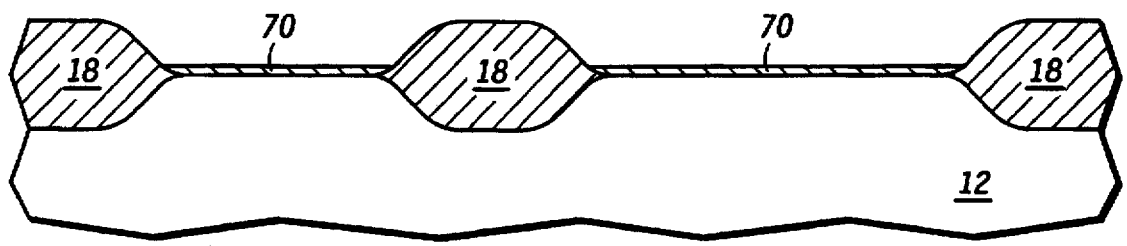
FIGS. 7–9 includes illustrations of an alternate embodiment of the present invention using differential gate dielectric layer thicknesses.
Figure 8:
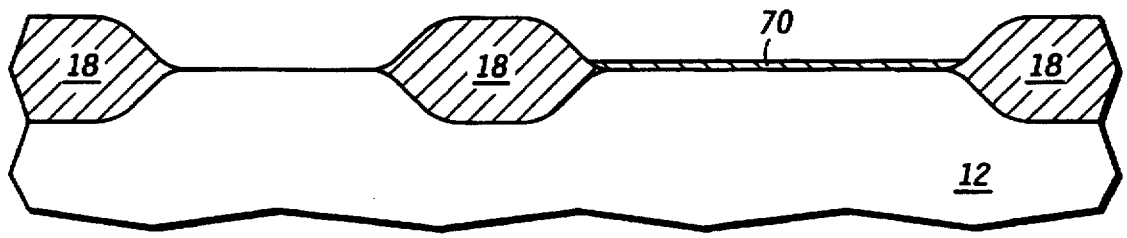
Figure 9:
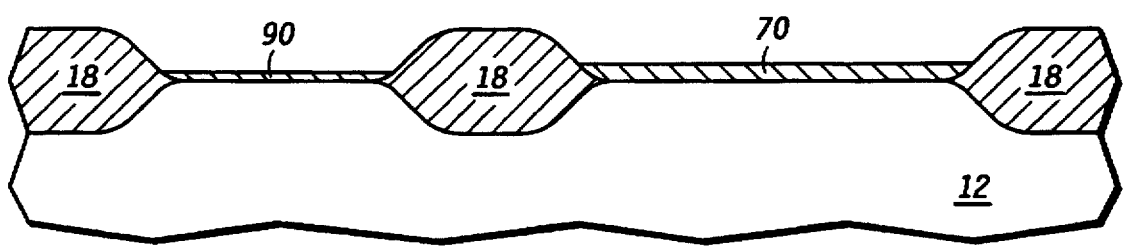

The present invention can be used in conjunction with other methods intended to improve the β ratio of the SRAM cell including resistors between the access transistors and storage nodes, differential gate doping, differential gate dielectric thicknesses, or the like. For differential gate dielectric thicknesses in a specific embodiment, a first gate dielectric layer 70 approximately 100 angstroms thick is formed over both regions of the substrate 12 where the latch and access transistors are formed as shown in FIG. 7. The first gate dielectric layer 70 is removed from over the region of the substrate 12 where the latch transistor will be formed as shown in FIG. 8. A second gate dielectric layer 90 approximately 50 angstroms thick is formed over the region of the substrate 12 where the latch transistors will be formed as shown in FIG. 9. The second gate dielectric layer 90 is formed by thermal oxidation of the substrate 12 and causes the first gate dielectric layer 80 to increase in thickness to approximately 125 angstroms. Processing continues as shown in FIGS. 2–6 to form a substantially completed device. Clearly, other embodiments are possible.

The embodiments of the present invention are performed without using exotic materials or processing steps having very little margin. Therefore, the processes of using the present invention typically forms a relatively high reliability SRAM cell that does not suffer from yield degradation due to the exotic materials or marginal processing steps.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:
    forming a first conductive layer over a substrate having a first region and a second region;
    forming a first dielectric layer over the first conductive layer;
    selectively etching the first dielectric layer to form a patterned first dielectric layer, wherein:
        a first portion of the first dielectric layer is removed over the first region of the substrate; and
        a second portion of the first dielectric layer remains over the second region of the first conductive layer;
    forming a second conductive layer over the patterned first dielectric layer and the first conductive layer; and
    selectively etching the first conductive layer, the first dielectric layer, and the second conductive layer to form a first gate electrode and a second gate electrode, wherein:
        the first gate electrode overlies the first region of the substrate and includes the first conductive layer and the second conductive layer; and
        the second gate electrode overlies the second region of the substrate and includes the first conductive layer, the second portion of the first dielectric layer, and the second conductive layer.

2. The process of claim 1, wherein the second gate electrode is a gate electrode for an access transistor of an SRAM cell.

3. The process of claim 1, wherein the first gate electrode is a gate electrode for a latch transistor of an SRAM cell.

4. The process of claim 1, further comprising a step of forming a first gate dielectric portion and a second gate dielectric portion before the step of forming the first conductive layer, wherein:
    the first gate dielectric portion overlies the first region of the substrate;
    the second gate dielectric portion overlies the second region of the substrate; and
    the first and second gate dielectric portions have substantially a same thickness.

5. The process of claim 1, further comprising steps of:
    forming a first gate dielectric film over the first and second regions of the substrate;
    etching the first gate dielectric film away from the second region of the substrate; and
    forming a second gate dielectric film over the second region of the substrate before the step of forming the first conductive layer.

6. The process of claim 1, wherein the step of forming the first conductive layer comprises a step of depositing a layer including a semiconductor material.

7. The process of claim 1, further comprising a step of forming an antireflective coating over the second conductive layer.

8. The process of claim 7, further comprising a step of forming a semiconductive layer comprising silicon between the second conductive layer and the antireflective coating.

9. The process of claim 1, wherein the step of forming the first dielectric layer comprises a step of thermally oxidizing the first conductive layer.

10. The process of claim 1, wherein the step of forming the first dielectric layer comprises a step of forming the first dielectric layer having a dielectric constant greater than five.

11. The process of claim 1, wherein the step of forming the first dielectric layer comprises a step of forming the first dielectric layer having a thickness in a range of approximately 30 to 150 angstroms.

12. The process of claim 1, wherein the step of forming the second conductive layer comprises a step of forming a silicide layer.

13. The process of claim 1, further comprising steps of:
    forming interconnects to the first and second gate electrodes; and
    forming a passivation layer over the interconnects.

* * * * *